US009966345B1

(12) United States Patent
Sizikov et al.

(10) Patent No.: US 9,966,345 B1
(45) Date of Patent: May 8, 2018

(54) PROTECTIVE BARRIER FOR INTEGRATED CIRCUIT PACKAGES HOUSING A VOLTAGE REGULATOR AND A LOAD

(71) Applicant: Google Inc., Mountain View, CA (US)

(72) Inventors: Gregory Sizikov, Sunnyvale, CA (US); Woon Seong Kwon, Cupertino, CA (US)

(73) Assignee: Google LLC, Mountain View, CA (US)

( * ) Notice: Subject to any disclaimer, the term of this patent is extended or adjusted under 35 U.S.C. 154(b) by 0 days. days.

(21) Appl. No.: 15/463,627

(22) Filed: Mar. 20, 2017

(51) Int. Cl.
| | |
|---|---|
| *H01L 23/495* | (2006.01) |
| *H01L 23/62* | (2006.01) |
| *H01L 23/498* | (2006.01) |
| *H01L 23/00* | (2006.01) |
| *H01L 21/48* | (2006.01) |

(52) U.S. Cl.
CPC .......... *H01L 23/62* (2013.01); *H01L 21/4853* (2013.01); *H01L 21/4857* (2013.01); *H01L 23/49822* (2013.01); *H01L 23/49838* (2013.01); *H01L 24/16* (2013.01); *H01L 2224/16227* (2013.01); *H01L 2924/1427* (2013.01); *H01L 2924/1433* (2013.01)

(58) Field of Classification Search
CPC ............... H01L 23/62; H01L 23/49822; H01L 23/49838; H01L 21/4853; H01L 21/4857; H01L 24/16; H01L 2224/16227; H01L 2924/1427; H01L 2924/1433

USPC ......................................................... 257/668
See application file for complete search history.

(56) References Cited

U.S. PATENT DOCUMENTS

2016/0157336 A1* 6/2016 Murai .................. H05K 1/0225
361/782

FOREIGN PATENT DOCUMENTS

WO        2016046987 A1      3/2016

* cited by examiner

*Primary Examiner* — Tu-Tu Ho
(74) *Attorney, Agent, or Firm* — McDermott Will & Emery LLP

(57) ABSTRACT

An IC package is configured to receive a voltage regulator and a load. The IC package includes a plurality of buildup layers disposed on a plurality of core layers. The buildup layers have a top side that includes first and second surface features for receiving the voltage regulator and the load, respectively. First and second pluralities of vias connect the first and second surface features, respectively, to a buildup conductor layer and a core conductor layer. The buildup conductor layer includes a substantially solid or continuous conductor plane extending across and connected to the first and second pluralities of vias. The buildup conductor layer defines a gap between the first and second pluralities of vias, the gap partially separating a portion of the conductor plane connected to the first plurality of vias from a portion connected to the second plurality of vias.

20 Claims, 6 Drawing Sheets

PROTECTIVE BARRIER FOR INTEGRATED CIRCUIT PACKAGES HOUSING A VOLTAGE REGULATOR AND A LOAD

BACKGROUND

Integrated circuit (IC) packages are used for protection and mounting of semiconductor dies onto printed circuit boards. Electrical contacts or "pads" of semiconductor dies can be electrically connected to the leads of the IC package by several mechanisms including wire bonding and controlled collapse chip connection ("C4" or "flip chip"). Complex, high pad count semiconductor dies such as application-specific integrated circuits and microprocessors may necessitate the use of multi-layer IC packages in order to route the many signal, power, and ground connections to and from the semiconductor die and the pins or contacts of the IC package. The layers of the IC package may include layers having different thicknesses, such as thicker "core layers" in the center sandwiched by thinner "buildup layers." The buildup layers and core layers can include alternating layers of conductor and dielectric. The conductor layers may include conductive traces for conveying signals, or substantially solid or continuous conductor planes for conveying higher currents for power and ground. Electrical connections between conductor layers are made with vias or micro vias, which are vertical holes through a substrate layer that include a conductor such as tin, gold, or copper. In some applications it may be beneficial to include one or more voltage regulators within the IC package for the purpose of supplying power to the semiconductor die load.

SUMMARY

At least one aspect is directed to an integrated circuit (IC) package. The IC package includes a plurality of core layers including alternating core conductor layers and core substrate layers. The IC package includes a plurality of buildup layers disposed on the plurality of core layers and having a top side opposite the plurality of core layers. The plurality of buildup layers include alternating buildup conductor layers and buildup substrate layers. The IC package includes first surface features on the top side for receiving a voltage regulator. The first surface features electrically connect to at least a first buildup conductor layer and a first core conductor layer by a first plurality of vias. The IC package includes second surface features on the top side for receiving a load. The second surface features electrically connect to the first buildup conductor layer and the first core conductor layer by a second plurality of vias. The first buildup conductor layer includes a substantially solid or continuous conductor plane extending across and electrically connected to the first plurality of vias and the second plurality of vias. The first buildup conductor layer includes a gap defined in the conductor plane between the first plurality of vias and the second plurality of vias. The gap at least partially separates a portion of the conductor plane connected to the first plurality of vias from a portion of the conductor plane connected to the second plurality of vias.

At least one aspect is directed to a method of fabricating an IC package. The method includes forming a plurality of core layers including alternating core conductor layers and core substrate layers. The method includes forming, on the plurality of core layers, a plurality of buildup layers including alternating buildup conductor layers and buildup substrate layers. The method includes forming, on a top side of the plurality of buildup layers opposite the plurality of core layers, first surface features for receiving a voltage regulator. The first surface features electrically connect to at least a first buildup conductor layer and a first core conductor layer by a first plurality of vias. The method includes forming, on the top side, second surface features for receiving a load. The second surface features electrically connect to the first buildup conductor layer and the first core conductor layer by a second plurality of vias. The first buildup conductor layer includes a substantially solid or continuous conductor plane extending across and electrically connected to the first plurality of vias and the second plurality of vias. The first buildup conductor layer includes a gap defined in the conductor plane between the first plurality of vias and the second plurality of vias. The gap at least partially separates a portion of the conductor plane connected to the first plurality of vias from a portion of the conductor plane connected to the second plurality of vias.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

Figure 1:
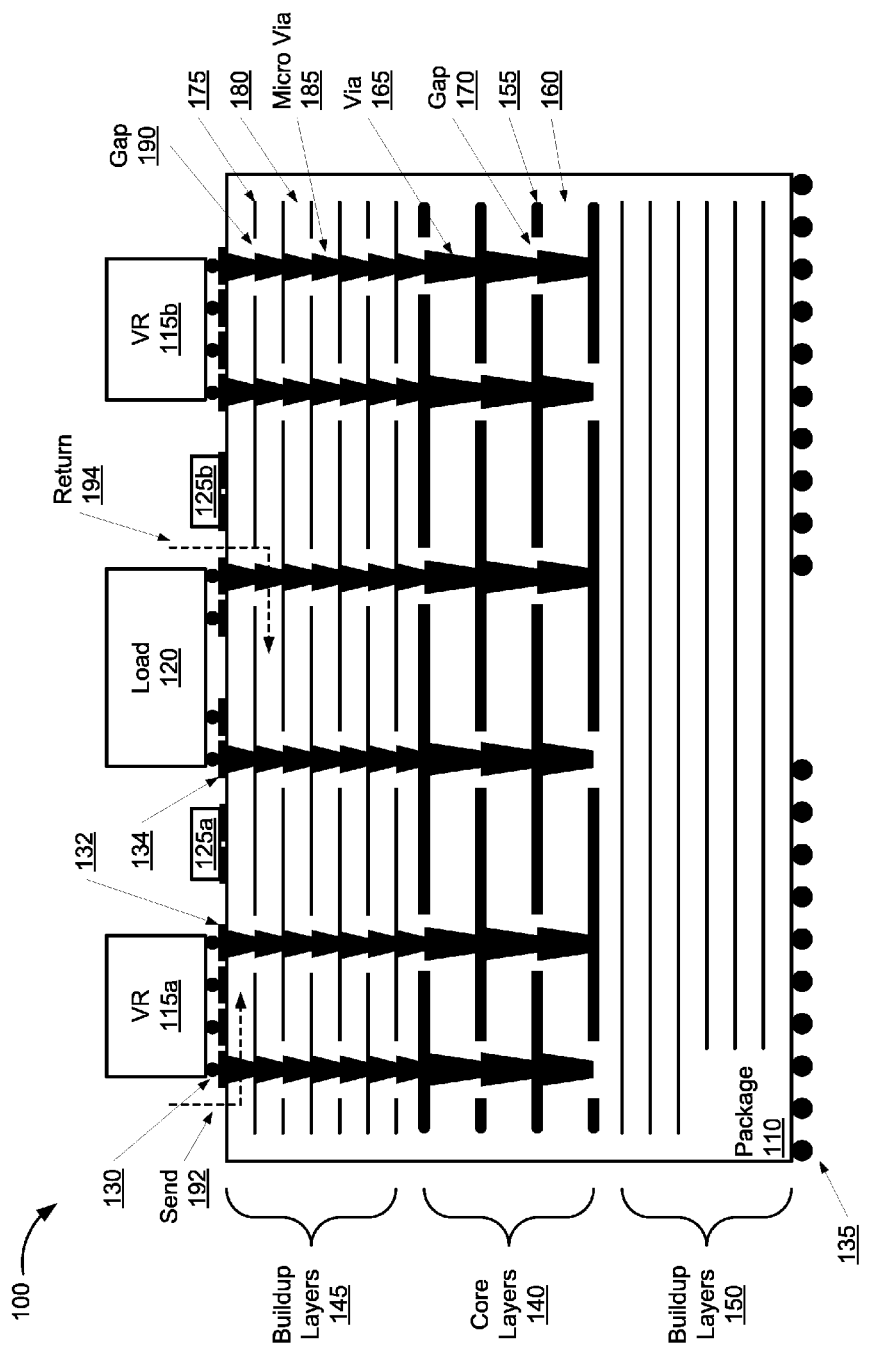
FIG. 1 illustrates a cross section of an example integrated circuit (IC) package having a voltage regulator and a load mounted on a top surface.

This disclosure generally relates to an integrated circuit (IC) package employing current barriers to prevent damage caused by high currents between an in-package voltage regulator and a load. Such a load could include, for example and without limitation, an application-specific integrated circuit, a field-programmable gate array, a microprocessor, a graphics processor, or a networking switch processor. The IC package includes conductor layers interspersed between dielectric substrate layers. The conductor layers can include a metal or other conductor such as tin, gold, or copper. The conductor layers can include power and ground (or power send and power return) layers, which comprise substantially solid or continuous conductor planes. Other conductor layers can include discrete signal traces for carrying data and other signals. The voltage regulator and the load can be positioned on a top side of the IC package. Electrical current flows between the voltage regulator and the load through the internal conductor planes of the IC package. The current passes to and from the internal conductor planes through vias, which are electrical connections between conductor layers. The IC package can include two types of layers: buildup layers and core layers. The IC package can be made up of a plurality of buildup layers on either side of a plurality of core layers. Both the buildup layers and the core layers can include conductor planes. In some implementations, the core layers can include conductor and substrate layers that are thicker than those of the buildup layers. Similarly, vias through the core layers can be larger in diameter than vias through the buildup layers. This disclosure refers to the smaller vias of the buildup layer as "micro vias." This disclosure refers to vias and micro vias collectively as "vias."

Placing a voltage regulator in the IC package with the load provides several advantages. For example, it can save space on the printed circuit board, allow the IC package to have fewer pins, and it can reduce the length of the current path between the voltage regulator and the load, thereby improving efficiency and saving power. When the voltage regulator and the load are placed in the same IC package, however, the current path is different from the typical current path in the IC package. When the voltage regulator is outside of the IC package, current follows a primarily vertical path through the package as it flows to and from the contacts on the bottom side of the package and the load on the top side of the package. When the voltage regulator is inside the IC package, the current follows a primarily lateral path traversing the conductor planes of the package.

Traditionally, the goal of routing high current paths is to minimize resistance and inductance by making the paths as short as possible and as wide in cross section as possible. In the context of a package containing a voltage regulator and a load on the same side, that means routing the current path through as many micro vias and conductor layers as possible, including the conductor planes of the top-side buildup layers, which are closer to the voltage regulator and load and thus require fewer vias in the current path. In high-power applications, however, current flows do not distribute uniformly through the vias and conductor layers. Large currents can concentrate in certain vias and conductor layers, causing heating, electro migration, and possibly failure of the micro vias and the conductor planes of the buildup layers, and connections between micro vias and conductor layers. Although attempts can be made to distribute the current among more micro vias and conductor layers, the current may not distribute evenly, and not solve the problem of current crowding or "hot spots" where the local current exceeds the current-carrying capability of individual micro vias and conductor planes of the buildup layer.

This disclosure proposes adding current barriers in the power and ground planes of the buildup layers. The current barriers can take the form of a gaps in the planes, where the gaps separate the conductor in the region of the voltage regulator from the conductor in the region of the load. The current barrier may partition the conductor layer partially (i.e., lengthening, but not blocking, current paths across the conductor layer) or completely (such that there is no contact between the respective portions of conductor). In embodiments in which the gap does not partition the conductor layer completely, the gap should be extensive enough to lengthen the portion of the current path that would normally flow through the particular micro vias at risk for developing hot spots. The lengthened current path can reduce the amount of current that would tend to flow through these particular micro vias, and direct that current to the remaining micro vias. This can also reduce the amount of current that would tend to flow through the buildup layers, and direct that current to the thicker core layers.

Adding current barriers to conductor planes of the buildup layers is a counterintuitive solution to problematic current distribution because it increases the impedance of the power delivery network by increasing the average current path length. This increases the resistance and inductance of the current paths. However, the current barrier allows the package to achieve better current distribution through the micro vias and conductor planes of the buildup layers, and helps avoid exceeding their current-carrying capability. The current barrier thus mitigates current hot spots and improves reliability, enabling the package to handle voltage regulators and loads consuming hundreds of watts to over a thousand watts.

FIG. 1 illustrates a cross section of an example integrated circuit (IC) package 110 having a voltage regulator and a load mounted on a top surface. The IC package 110 is part of a system 100 that includes one or more voltage regulators 115a and 115b (collectively "voltage regulators 115") and one or more loads 120 mounted on a top side of the IC package 110. The loads 120 can include, without limitation, one or more of application-specific integrated circuit, a field-programmable gate array, a microprocessor, a graphics processor, or a networking switch processor. The voltage regulators 115 can include, without limitation, one or more of a switched-mode power supply, a direct-current voltage regulator, an alternating-current-to-direct-current power convertor, or direct-current-to-direct-current converter. The system 100 can optionally include one or more bypass capacitors 125a and 125b (collectively "bypass capacitors 125") across power supply rails; i.e., bridging a current forward path and a current return path. The bypass capacitors 125 can prevent unwanted signals in one part of the circuit from affecting other parts of the circuit; for example, to keep AC rippled from a power supply from reaching a processor, or to keep switching noise from a processor from propagating along the power supply rails to other components of the circuit. The voltage regulators 115 and the load 120 can be mounted to surface features 132 and 134 of the IC package 110 with solder connections 130. The IC package 110 itself can be mounted to a PCB (not shown) via solder connections 135. The system 100 may optionally include a heat sink, heat pump, thermal lid, stiffener, or heat spreader (not shown) mounted over and in contact with the voltage regulators 115 and the load 120 for the purpose of dissipating heat.

The IC package 110 includes core layers 140 sandwiched between buildup layers 145 and 150. The core layers 140 include one or more alternating core conductor layers 155 and core substrate layers 160. The core conductor layers 155 can include any electrically conductive metal or non-metal, but will typically include copper. The core substrate layers 160 can include a dielectric material such as a ceramic, polymer, or resin and can be impregnated with glass or other inorganic dielectric. Electrical connections between adjacent core conductor layers 155 are made with vias 165. Multiple vias 165 can be stacked to make an electrical connection between non-adjacent core conductor layers 155. If a stack of vias 165 passes through a core conductor layer 155 to which it is not to make an electrical connection, the unconnected core conductor layer 155 can define a gap 170 around the via 165. The gap 170 surrounds and electrically isolates the via 165, but does not otherwise block currents in the core conductor layer 155. Each core conductor layer 155 can be a signal layer that includes primarily signal traces, or a power/ground layer that is a substantially solid or continuous planar conductor layer. In some implementations, a coper layer can include a combination of signal traces and a power/ground conductor plane.

The IC package 110 includes buildup layers 145 and 150 sandwiching the core layers 140. The top buildup layers 145 include one or more alternating buildup conductor layers 175 and buildup substrate layers 180. The buildup conductor layers 175 can include any electrically conductive metal or non-metal, but will typically include copper. The buildup substrate layers 180 can include a dielectric material such as a ceramic, polymer, or resin and can be impregnated with glass or other inorganic dielectric. Electrical connections between adjacent buildup conductor layers 175 are made with micro vias 185. Multiple micro vias 185 can be stacked to make an electrical connection between non-adjacent core conductor layers 175. If a stack of micro vias 185 passes through a buildup conductor layer 175 to which it is not to make an electrical connection, the unconnected buildup conductor layer 175 can define a gap 190 around the micro vias 185. The gap 190 surrounds and electrically isolates the micro via 185, but does not otherwise block currents in the buildup conductor layer 175. Each buildup conductor layer 175 can be a signal layer that includes primarily signal traces, or a power/ground layer that is a substantially solid or continuous planar conductor layer. In some implementations, a coper layer can include a combination of signal traces and a power/ground conductor plane.

In some implementations, the core layers 140 can be thicker than the buildup layers 145 and 150. A core conductor layer 155 can be about 35 μm thick, but can be set to between about 20 and about 70 μm, or to between about 10 and about 140 μm thick. A core substrate layer 160 can be about 60 μm thick, but can set to between about 30 and about 120 μm, or to between about 15 and about 240 μm thick. A buildup conductor layer 175 can be about 15 μm thick, but can set to between about 10 and about 30 μm, or to between about 5 and about 60 μm thick. A buildup substrate layer 180 can be about 25 μm thick, but can set to between about 15 and about 60 μm, or to between about 10 and about 100 μm thick.

In some implementations, the vias 165 of the core layers 140 can be wider than the micro vias 185 of the buildup layers 145. The vias 165 and micro vias 185 include a conductive pad in a conductor layer connected to a conductor routed through a vertical hole in a substrate layer. The pad is an annular ring, square, or other polygon of conductor in or on the conductor layer. In a power/ground layer, the pad may not be distinct from the substantially solid or continuous planar conductor. In signal trace layers, however, the pad ensures that any traces have adequate surface conductor to which to connect to the conductor in the hole. In some implementations, the vias 165 of the core layers 140 can have a pad having a diameter of about 175 μm over a hole having a diameter of about 75 μm. The via 165 pads can be of any acceptable size; for example, between about 100-250 μm, or between about 50-500 μm in diameter. The via 165 holes can be of any acceptable size; for example, between about 50-150 μm, or between about 25-300 μm in diameter.

Similarly, the micro vias 185 of the buildup layers 145 can have a pad having a diameter of about 100 μm over a hole having a diameter of about 60 μm. The micro via 185 pads can be of any acceptable size; for example, between about 50-200 μm, or between about 25-400 μm in diameter. The micro via 185 holes can be of any acceptable size; for example, between about 30-120 μm, or between about 15-240 μm in diameter.

The micro vias 185 can also form electrical connections between surface features 132 and 134 on a top side of the buildup layers 145 and an internal buildup conductor layer 175. The surface features 132 and 134 include solder pads or holes for mounting the voltage regulators 115, loads 120, bypass capacitors 125, and any other components included in the package 110. Each surface feature can connect to internal signal traces or power/ground planes of the package 110 through micro vias 185 and/or vias 165. In some cases, particularly for high-current and high-power current paths, a surface feature will connect to multiple micro vias 185. For example, a surface feature coming from a current forward or return pin of a voltage regulator or load may connect to tens or hundreds of micro vias 185.

Current paths formed by the various surface features, vias, and conductor layers can convey current between the voltage regulators 115 and the load 120. Multiple current paths can exist for each connection between the voltage regulator 115 and the load 120. The current paths may be split between many vias 165 and 185 and several conductor layers 175 and 155. For example, one possible path for current from the voltage regulator 115a to the load 120 includes the current forward path 192; however, the current forward path 192 can include paths through additional micro vias 185 and conductor layers 175 and 155. Similarly, one possible path for return current from the load 120 to the voltage regulator 115a includes the current return path 194; however, the current return path 194 can include paths through additional micro vias 185 and conductor layers 175 and 155. Under typical design practices, power supply current path impedance is kept low. To that end, the current forward path 192 and the current return path 194 are kept short while their total cross sections are kept high. The cross section is determined by the number and size of vias 185 and 165, and the number and size of buildup conductor layers 175 and core conductor layers 155, in the path. Even if many vias and conductor layers are included in the current paths, however, current will tend to flow along the path of least resistance. Therefore the current may not distribute evenly through all of the vias and conductor layers in the current path. Rather, the current will concentrate through the vias and conductor layers that create the shortest of all possible current paths. In the IC package 110, that means that the current will favor the vias closer to the destination of the current, and conductor layers closer to the top of the IC package 110. In high-power application, where the voltage regulators 115 are producing 100, 300, 500, or over 1,000 watts, current crowding or "hot spots" can exceed the current-carrying capability of individual vias and conductor layers.

Figure 2:
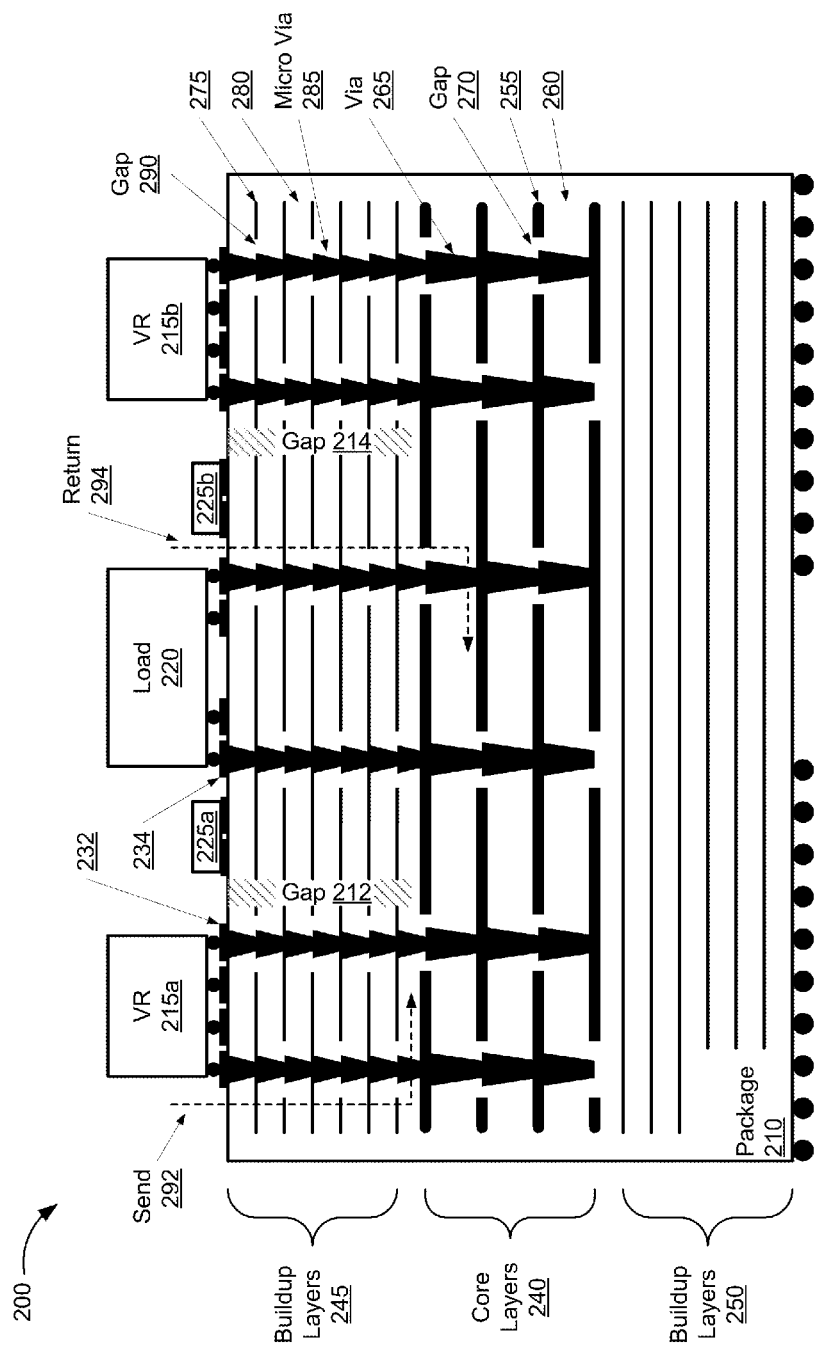
FIG. 2 illustrates a cross section of an example IC package having current barriers in the buildup layers between a voltage regulator and a load, according to an illustrative implementation.

FIG. 2 illustrates a cross section of an example IC package 210 having current barriers 212 and 214 in the buildup layers 245 between a voltage regulator 215 and a load 220, according to an illustrative implementation. Several features of the IC package 210 and the system 200 are similar to those of the IC package 110 and the system 110. The IC package 210 is part of a system 200 that includes one or more voltage regulators 215a and 215b (collectively "voltage regulators 215") and one or more loads 220 mounted on a top side of the IC package 210. The system 200 can optionally include one or more bypass capacitors 225a and 225b (collectively "bypass capacitors 225") across power supply rails. In some implementations, the bypass capacitors 225 can be placed on the top side and/or bottom side of the IC package 210. The IC package 210 includes core layers 240 sandwiched between buildup layers 245 and 250. The core layers 240 include one or more alternating core conductor layers 255 and core substrate layers 260. Electrical connections between adjacent core conductor layers 255 are made with vias 265. Multiple vias 265 can be stacked to make an electrical connection between non-adjacent core conductor layers 255. If a stack of vias 265 passes through a core conductor layer 255 to which it is not to make an electrical connection, the unconnected core conductor layer 255 can define a gap 270 around the via 265. The top buildup layers 245 include one or more alternating buildup conductor layers 275 and buildup substrate layers 280. Electrical connections between adjacent buildup conductor layers 275 are made with micro vias 285. Multiple micro vias 285 can be stacked to make an electrical connection between non-adjacent core conductor layers 275. If a stack of micro vias 285 passes through a buildup conductor layer 275 to which it is not to make an electrical connection, the unconnected buildup conductor layer 275 can define a gap 190 around the micro vias 285. Multiple current paths can exist for each connection between the voltage regulators 215 and the load 220. The current paths may be split between many vias 285 and 265 and several conductor layers 275 or 255. For example, one possible path for current from the voltage regulator 215a to the load 220 includes the current forward path 292; however, the current forward path 292 can include paths through additional vias 285 and 265 and conductor layers 275 and 255. Similarly, one possible path for return current from the load 220 to the voltage regulator 215a includes the current return path 294; however, the current return path 294 can include paths through additional vias 285 and 265 and conductor layers 275 and 255. A typical IC package 210 can have various numbers of core layers 240 and buildup layers 245 and 250. In general, IC packages 210 configured for handling higher amounts of power or higher numbers of signal lines will have a greater number of core layers 240 and buildup layers 245 and 250. In some implementations, the IC package 210 can have two core layers 240, two buildup layers 245, and two buildup layers 250. In some implementations, the IC package 210 can have fourteen core layers 240, seven buildup layers 245, and seven buildup layers 250. In some implementations, the number of each of the layers can be anywhere from 3-30.

The IC package 210 includes current barriers 212 and 214. The current barriers 212 and 214 are formed by defining a gap in some or all of the buildup conductor layers 275 of the top buildup conductor layers 245. The current barriers 212 and 214 can be formed in buildup conductor layers 275 having a ground or power (current forward or current return) plane. The current barriers 212 and 214 may not be formed in buildup conductor layers 275 that primarily include relatively low-power signal traces. The gap need only be wide enough to prevent voltage breakdown across itself. At the typically low voltages of voltage regulator and load operation, the gap width can be the minimum resolving distance of the IC package fabrication process; for example, 1, 5, or 10 μm. The current barriers 212 and 214 are formed between a region in the vicinity of the voltage regulator 215 (the "voltage regulator 215 region") and a region in the vicinity of the load 220 (the "load 220 region"), and serve to partially or completely obstruct the current path between the voltage regulator 215 and the load 220 in that buildup conductor layer 275. Depending on the extent of the current barriers 212 and 214, the current barriers 212 and 214 alter the current distribution of the current forward paths 292 and the current return paths 294 in favor of the thicker core conductor layers 255 that can handle more current than the buildup conductor layers 275. In addition, the current barriers 212 and 214 can alter the shape of the current forward paths 292 and the current return paths 294 to better distribute current among vias 285 and 265 and conductor layers 275 and 255. For example, the current barriers 212 and 214 can reduce the relative difference in impedance of current paths through different micro vias 285 such that the current is better distributed among them. This can reduce the effect of current crowding and prevent vias from exceeding their current-carrying capability. The current barriers 212 and 214 can vary in size and shape to distribute current as desired. Several example implementations of current barriers 212 and 214 are described below with regard to FIGS. 3 through 5.

The current barriers 212 and 214 would seem to be a counterintuitive solution to the problem of exceeding current limits in vias and conductor layers. The current barriers 212 and 214 increase the average current path length, which increases the resistance and inductance of the current paths. The benefit, however, is better current distribution through the vias and conductor layers, including diverting current into the thicker core layers. The current barriers 212 and 214 thus mitigate current hot spots and improve reliability, enabling the package to handle higher power levels despite increased impedance of the power supply network.

Figure 3:
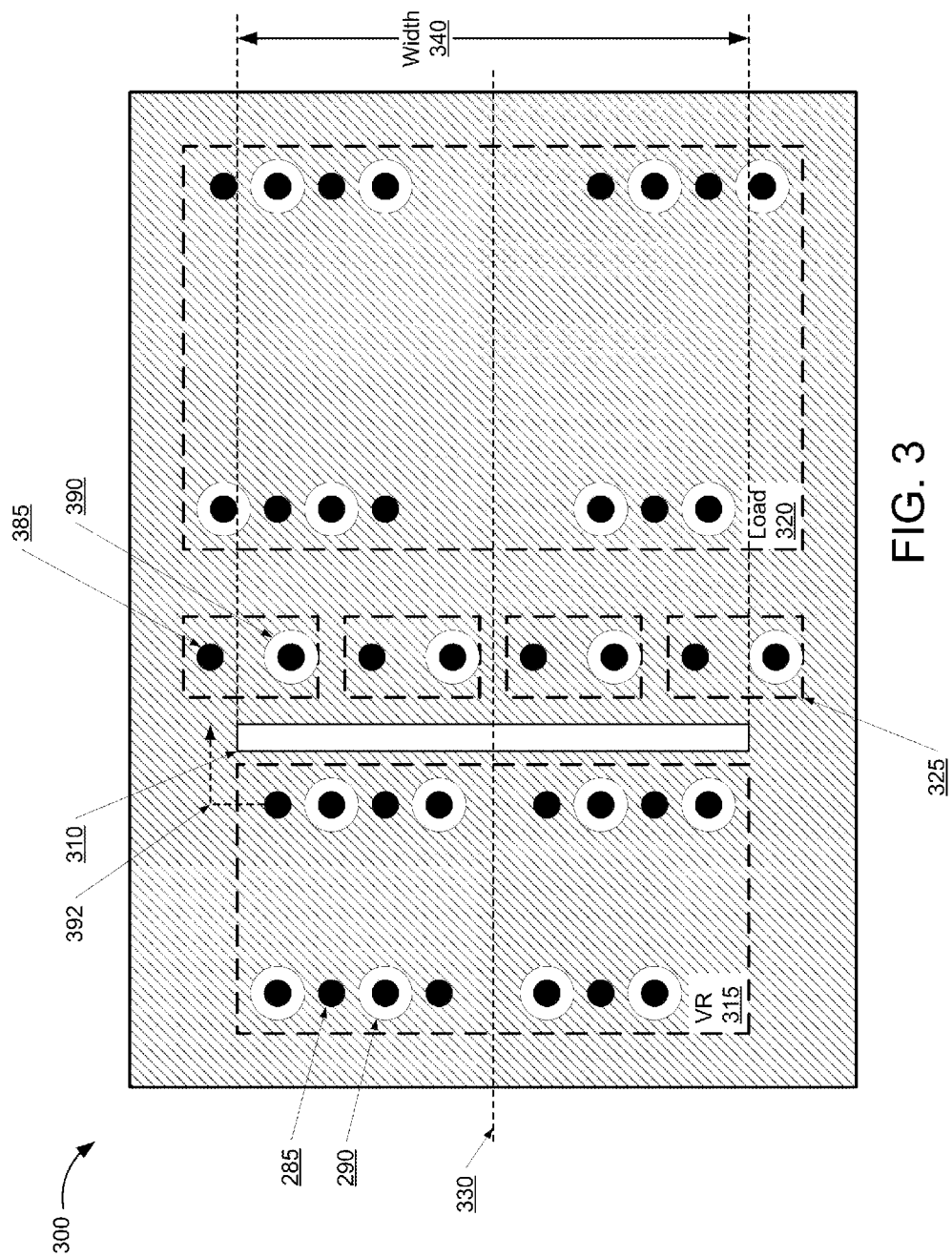
FIG. 3 shows a single conductor layer of a buildup layer with a current barrier that partially partitions the conductor layer, according to an illustrative implementation.

FIG. 3 shows a single conductor layer 300 of a buildup layer 245 with a current barrier 310 that partially partitions the conductor layer 300, according to an illustrative implementation. The conductor layer 300 can be one of the buildup conductor layers 275 having a power or ground (current forward or current return) plane. The current barrier 310 obstructs a current path 392 such that it must curve around the current barrier 310. FIG. 3 shows dotted lines outlining a region in the vicinity of the voltage regulator 315 (the "voltage regulator 315 region"), a region in the vicinity of the load 320 (the "load 320 region"), and regions in the vicinities of the bypass capacitors 325 ("bypass capacitor 325 regions"). The voltage regulator 315 region can also define a region containing the micro vias 285 that connect to the surface features 232 that receive the voltage regulator 215. The load 320 region can also define a region containing the micro vias 285 that connect to the surface features 234 that receive the load 220. The conductor layer 300 includes micro vias 285 that are electrically connected to the conductor layer 300. The conductor layer 300 includes other micro vias that are electrically isolated from the conductor layer 300 by gaps 290. An axis 330 bisects the voltage regulator 315 region and the load 320 region. The current barrier 310 can extend to a length 340 in a direction orthogonal to the axis 330. FIG. 3 is not drawn to scale; in particular, the length 340 of the current barrier 310 can extend to any length relative to other features of the conductor layer 300, as described in more detail below.

In the example shown in FIG. 3, the conductor layer 300 is in the current forward path 292 from the voltage regulator 215 to the load 220. The micro vias 285 in the voltage regulator 315 region electrically connect the conductor layer 300 to surface features 232 of the IC package 210, which themselves are electrically connected to current-send contacts of the voltage regulator 215. Likewise the micro vias 285 in the load 320 region electrically connect the conductor layer 300 to surface features 234 of the IC package 210, which themselves are electrically connected to current-receive contacts of the load 220. Conversely, the micro vias having gaps 290 carry current to and from a second buildup conductor layer 275 (not shown) that makes up part of the current return path 294. Dedicated micro vias 385 and micro vias with gaps 390 electrically connect surface features that receive the bypass capacitors 225 to the buildup conductor layers 275 and core conductor layers 255 of the current forward and current return paths, respectively.

The current barrier 310 does not completely partition the conductor layer 300. Current can still flow to and from the voltage regulator 215 and load 220 via the current path 392 around the current barrier 310. The extra travel distance increases the impedance of the current path, causing current to favor paths in other layers, and in particular the thicker core conductor layers 255. Without the current barrier 310, current may tend to concentrate at the upper-right-most micro via 285. With the current barrier 310, the current path 392 from that micro via 285 is lengthened, increasing the apparent impedance of current paths associated with that micro via 285 and consequently reducing the current flowing through it in favor of other possible current paths.

The current barrier 310 can be made to a length designed to effect the desired current distribution. For example, the current barrier 310 length 340 can be based on the dimensions of respective regions containing the vias 285 and 265 or surface features 232 and 234 associated with the voltage regulator 215 and the load 220, respectively. In some embodiments, the current barrier 310 extends to a length 340, measured in a direction orthogonal to the axis 330 and parallel to a plane defined by the conductor layer 300, that is at least as long as a length of the voltage regulator 315 region measured in the same direction. In some embodiments, the current barrier 310 extends to a length 340 that is at least as long as a length of the load 320 region measured in the same direction.

Figure 4:
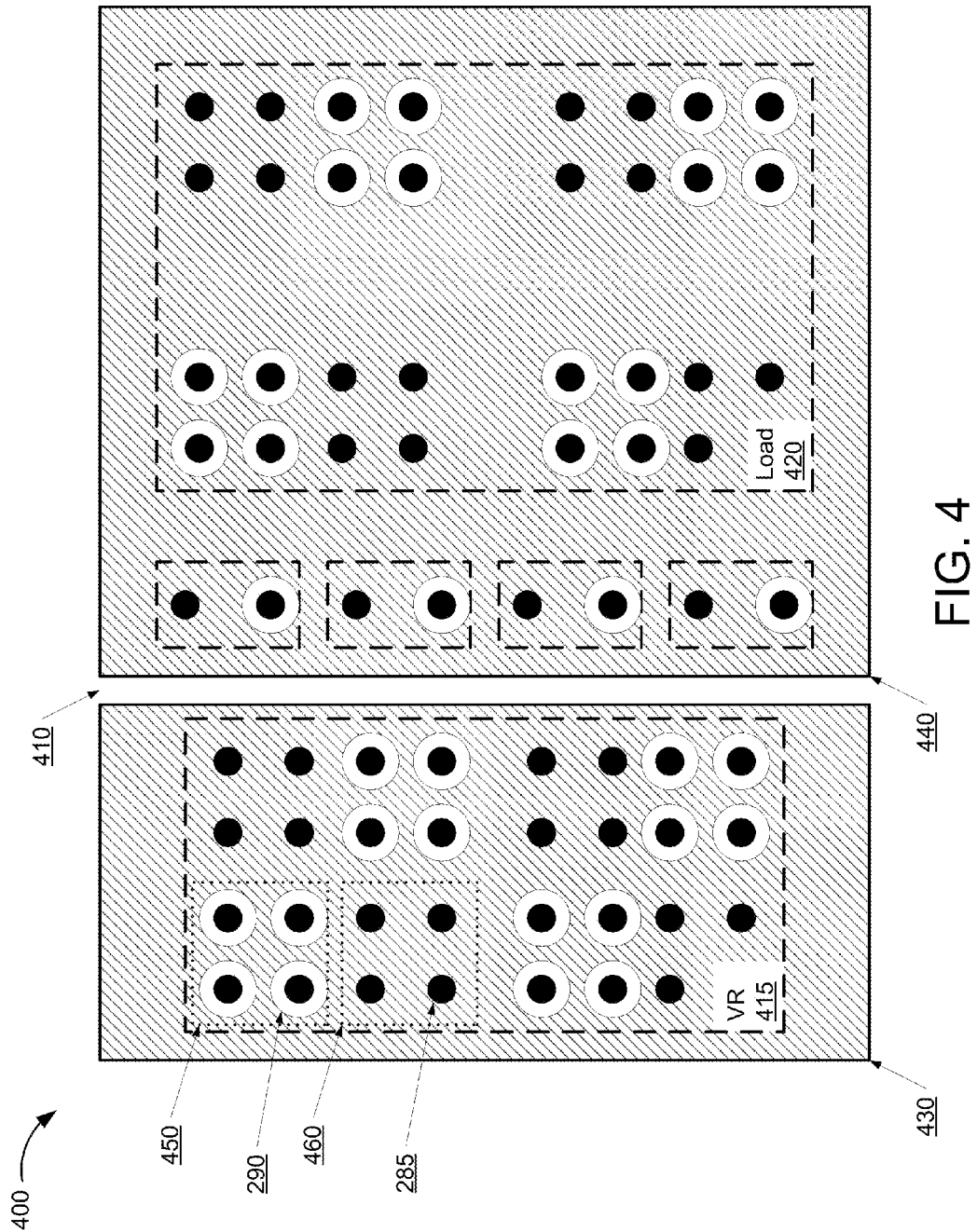
FIG. 4 shows a single conductor layer of a buildup layer with a current barrier that completely partitions the conductor layer, according to an illustrative implementation.

FIG. 4 shows a single conductor layer 400 of a buildup layer 245 with a current barrier 410 that completely partitions the conductor layer 400, according to an illustrative implementation. The conductor layer 400 can be one of the buildup conductor layers 275 having a power or ground (current forward or current return) plane. The current barrier 410 partitions the conductor layer 400 into two partitions 430 and 440 that have no electrical connection within the conductor layer 400 itself (although indirect electrical connections between the partitions 430 and 440 may exist through the micro vias 285 and connections in other conductor layers). There is thus no current path between the voltage regulator 215 and the load 220 across the conductor layer 400.

FIG. 4 additionally illustrates an implementation in which a surface feature is associated with multiple micro vias 285. For example, an area of a first surface feature 450 and an area of a second surface feature 460 are shown within a region in the vicinity of the voltage regulator 415 (the "voltage regulator 415 region"). The first surface feature is electrically connected to four micro vias having gaps 290 in the area of the first surface feature 450. The first surface feature therefore does not electrically connect to the conductor layer 400, but may connect to other conductor layers. The second surface feature is electrically connected to four micro vias 285 in the area of the second surface feature 460. The second surface feature therefore electrically connects to the conductor layer 400. In some implementations, a surface feature may only connect to a single micro via 285. In some implementations, a surface feature may connect to tens or hundreds of micro vias 285.

Figure 5:
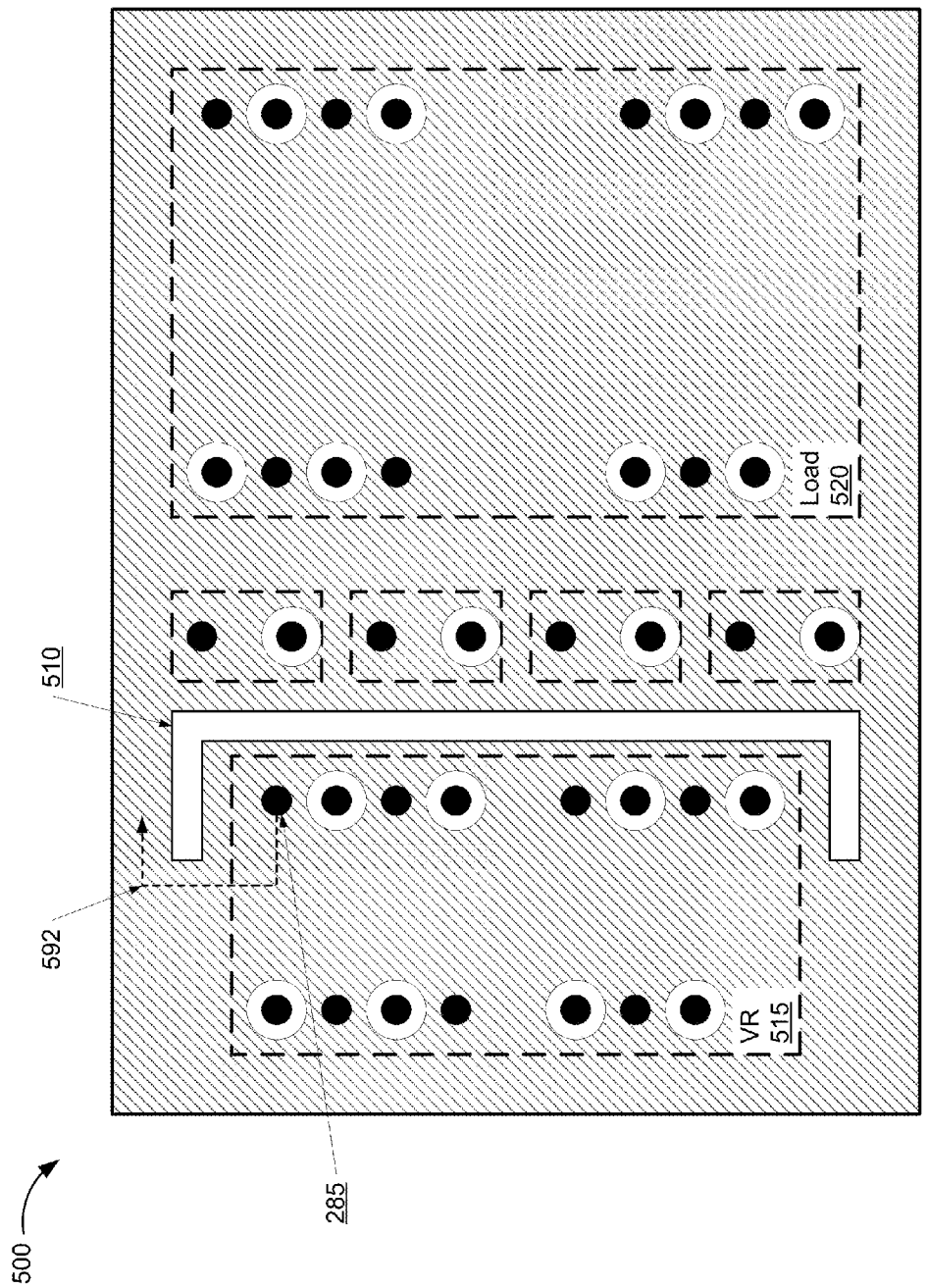
FIG. 5 shows a single conductor layer of a buildup layer with a current barrier partially enclosing an area of the conductor layer in a region of a voltage regulator, according to an illustrative implementation.

FIG. 5 shows a single conductor layer 500 of a buildup layer 245 with a current barrier 510 partially enclosing an area of the conductor layer 500 in a region in the vicinity of a voltage regulator 515 (the "voltage regulator 515 region"), according to an illustrative implementation. The conductor layer 500 can be one of the buildup conductor layers 275 having a power or ground (current forward or current return) plane. The current barrier 510 can be of any shape and include curves and/or angles to bring about the desired current distribution in the conductor layer 500. In the example implementation shown in FIG. 5, the current barrier 510 curves back around the voltage regulator 515 region to lengthen a current path 592 from the upper-right-most micro via 285 to its destination in a region of the load 520. Without the current barrier 510, current may tend to concentrate at the upper-right-most micro via 285 in the voltage regulator 515 region. With the current barrier 510, the current path 592 from that micro via 285 is lengthened, increasing the apparent impedance of current paths associated with that micro via 285 and consequently reducing the current flowing through it.

Figure 6:
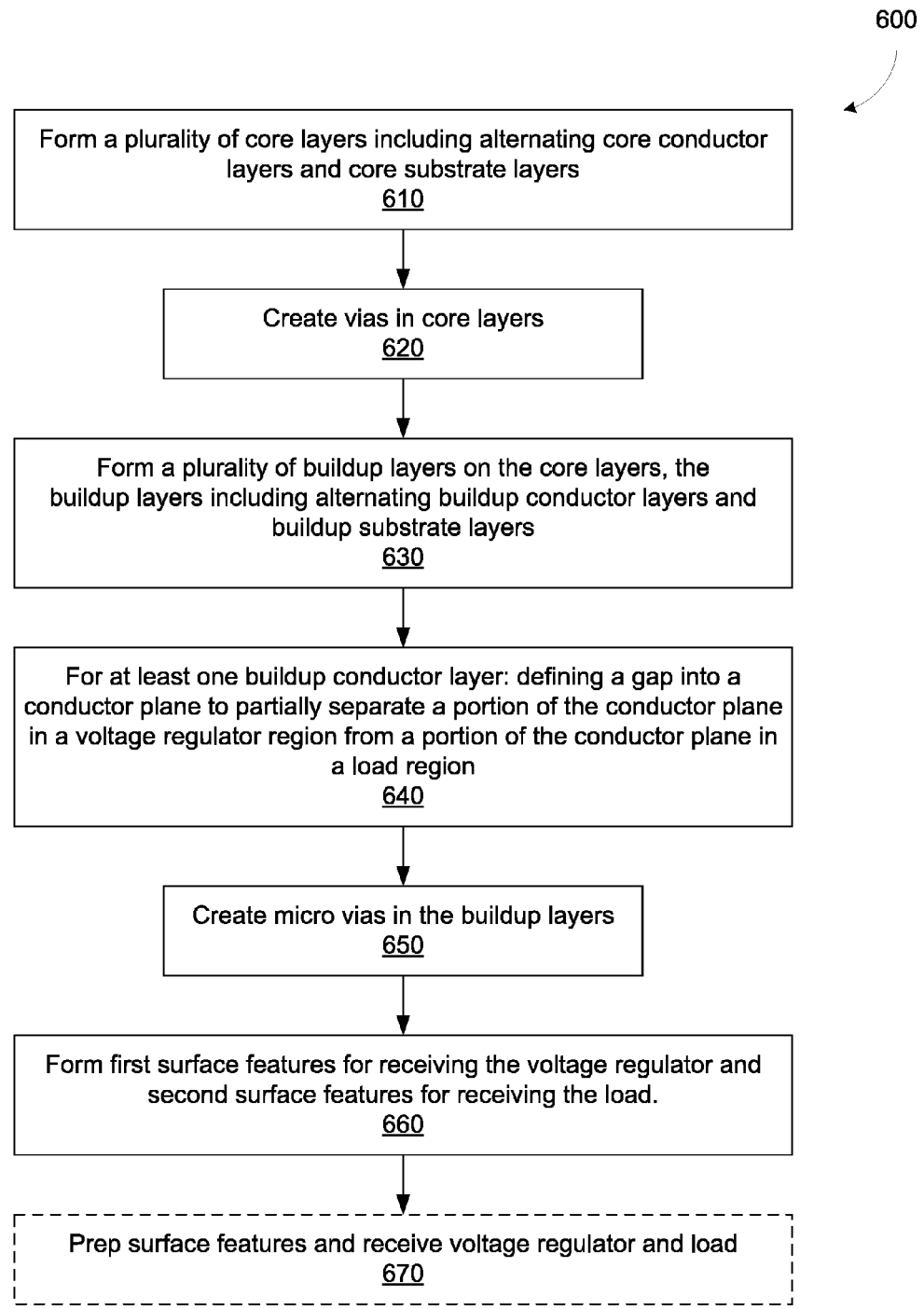
FIG. 6 is a flowchart showing stages of an example method of fabricating an IC package having a current barrier in a buildup conductor layer, according to an illustrative implementation.

FIG. 6 is a flowchart showing an example method 600 of fabricating an IC package having a current barrier in a buildup conductor layer, according to an illustrative implementation. The method 600 can be implemented to fabricate IC packages including the IC package 210 described in FIG. 2 and having one or more buildup conductor layers with the configuration of the conductor layers 300, 400, and/or 500 described in FIGS. 3, 4, and 5, respectively. The method 600 describes example methods for fabricating such an IC package; however, other methods may be used without departing from the scope of the disclosure. For example, methods having more of fewer steps, or implementing steps in different orders, may also fall within the scope of the disclosure.

The method 600 includes forming a plurality of core layers including alternating core conductor layers and core substrate layers (stage 610). The method 600 includes creating vias in the core layers (stage 620). The method 600 includes forming a plurality of buildup layers on the core layers, the buildup layers including alternating buildup conductor layers and buildup substrate layers (stage 630). The method 600 includes, for at least one buildup conductor layer: defining a gap into a conductor plane to partially separate a portion of the conductor plane in a voltage regulator region from a portion of the conductor plane in a load region (stage 640). The method 600 includes creating micro vias in the buildup layers (stage 650). The method 600 includes forming first surface features for receiving the voltage regulator and second surface feature for receiving the load (stage 660). The method 600 can optionally include preparing the first surface features and the second surface features to receive the voltage regulator and the load (stage 670).

The method 600 includes forming a plurality of core layers 240 including alternating core conductor layers 255 and core substrate layers 260 (stage 610). The core layers 240 can be formed by a one or more, or a combination, of laminating, deposition, etching, machining, and/or additive manufacturing processes. In some implementations, a first core substrate layer 260 can be plated with a core conductor layer 255. The core conductor layer 255 can be masked and etched to create the desired pattern. Alternatively, an additive manufacturing process can deposit or print the first core conductor layer 255 onto the first core substrate layer 260 in the desired pattern. The resulting pattern can include signal traces, a power or ground (current forward or current return)

plane, or a combination of the two. The resulting pattern can additionally include pads for connecting to vias 265, and gaps 270 or other features for electrically isolating different regions of the first core conductor layer 255. Subsequent core substrate layers 260 and core conductor layers 255 can formed on the first core substrate layer 260 and first core conductor layer 255 by repeating the process. The process can be repeated for the desired number of core layers 240.

At least one core conductor layer 255 will include a substantially solid or continuous conductor plane. Such a conductor plane can be used as a power or ground (current forward or current return) plane for carrying relatively large currents between a power source, such as the voltage regulator 215, and the load 220. The conductor plane formation process may include forming gaps 290 for vias passing through, but not electrically connecting to, the core conductor layer 255. In some implementations, the conductor plane can take the form of a mesh or other pattern of holes or perforations. The conductor plane will, however, be substantially solid or continuous to minimize impedance of current paths across it of current paths across it.

The method 600 includes creating vias 265 in the core layers 240 (stage 620). The vias 265 can electrically connect respective core conductor layers 255. Stacks of vias 265 can electrically connect non-neighboring core conductor layers 255. In some implementations, vias 265 can be created after patterning of each core conductor layer 255 and core substrate layer 260. In some implementations, the vias 265 can be created through all of the core layers 240 after the core layers 240 have been assembled together. In some implementations, each via 265 can be formed by creating a hole through the conductor and substrate of a core layer 240. The hole may be created by mechanical drill, laser, or etch process. The hole can then be plated, filled, or partially filled with a conductor. This can be accomplished by inserting an electrically conductive tube or rod into the hole, or by depositing or printing metal or other conductor onto the wall of the hole. The conductor in the hole will electrically connect to a pad or planar conductor on at least one of its top or bottom. A via 265 connecting neighboring core conductor layers 255 will electrically connect to a pad or planar conductor on both its top and bottom. For a via 265 forming a part of a via stack, the top and bottom of the hole conductor will electrically connect to either a pad, planar conductor, and/or hole conductor of another via 265 or micro via 285 in the stack. In some implementations, the vias 265 can be formed by an additive manufacturing process involving layered deposition of dielectric and conductive materials. In implementations employing additive manufacturing processes, the vias 265 can be created concurrently with the formation of the core layers 240.

The method 600 includes forming a plurality of buildup layers 245 on the core layers 240 (stage 630), the buildup layers 245 including alternating buildup conductor layers 275 and buildup substrate layers 280. The plurality of buildup layers 245 can be formed using one or more of the processes used for formation of the core layers 240 as described above; however, either the or both of the fabrication technique or materials used may differ from that used in forming the core layers 240. For example, the core layers 240 may be formed by laminating ceramic core substrate layers 260, while the buildup layers 245 may be formed by depositing epoxy resin buildup substrate layers 280. Similarly, the core conductor layers 255 may be formed by chemical etching of a substantially complete or solid conductor layer, while the buildup conductor layers 275 may be formed by depositing a conductor using an additive manufacturing technique. One or more of these processes may be implemented, combined, and/or repeated until the desired number of buildup layers 245 are formed.

At least one buildup conductor layer 275 will include a substantially solid or continuous conductor plane. Such a conductor plane can be used as a power or ground (current forward or current return) plane for carrying relatively large currents between a power source, such as the voltage regulator 215, and the load 220. The conductor plane formation process may include forming gaps 290 for vias passing through, but not electrically connecting to, the buildup conductor layer 275. In some implementations, the conductor plane can take the form of a mesh or other pattern of holes or perforations. The conductor plane will, however, be substantially solid or continuous to minimize impedance of current paths across it.

The method 600 includes, for at least the one buildup conductor layer 275: defining a gap into the conductor plane to partially separate a portion of the conductor plane in a voltage regulator region from a portion of the conductor plane in a load region (stage 640). This gap forms the current barrier 310, 410, or 510 shown in FIGS. 3-5, respectively. FIGS. 3-5 show example buildup conductor layers 275 including a substantially solid or continuous conductor plane. FIGS. 3-5 show that the conductor plane may not be completely solid, but may include gaps 290 and a current barrier 310, 410, or 510. The gap can partially or completely divide the conductor plane into two portions. For example, FIG. 3 shows a current barrier 310 etched, cut, or otherwise patterned into the coper plane. The current barrier 310 only partially divides the conductor plane, but obstructs a direct current path between the micro vias 285 that may experience current crowding, thereby improving the distribution of current through all of the micro vias 285. FIG. 4 shows an implementation of a current barrier 410 that completely divides the conductor plane. In the case of the buildup conductor layer 400, there is no direct current path between the two partitions 430 and 440 within the conductor layer 400. The current must flow through different layers, and in particular one or more of the core conductor layers 255. FIG. 5 shows a more elaborately shaped current barrier 510. The current barrier 510 can be implemented to reduce the relative difference in length and/or impedance of respective current paths from different micro vias 285 to improve current distribution across the micro vias 285.

The method 600 includes creating micro vias 285 in the buildup layers 245 (stage 650). The micro vias 285 can electrically connect respective buildup conductor layers 275. Stacks of micro vias 285 can connect non-neighboring buildup conductor layers 275. In some implementations, micro vias 285 can be created after patterning of each buildup conductor layer 275 and buildup substrate layer 280. In some implementations, micro vias 285 can be created through all of the buildup layers 245 after the buildup layers 245 have been assembled together. In some implementations, each micro via 285 can be formed by creating a hole through the conductor and substrate of a buildup layer 245. The hole may be created by mechanical drill, laser, or etch process. The hole can then be plated, filled, or partially filled with a conductor. This can be accomplished by inserting an electrically conductive tube or rod into the hole, or by depositing or printing metal or other conductor onto the wall of the hole. The conductor in the hole will electrically connect to a pad or planar conductor on at least one of its top or bottom. A micro via 285 connecting neighboring buildup conductor layers 275 will electrically connect to a pad or planar conductor on both its top and bottom. For a micro via 285 forming a part of a via stack, the top and bottom of the hole conductor will electrically connect to either a pad, planar conductor, and/or hole conductor of another via 265 or micro via 285 in the stack. In some implementations, the micro vias 285 can be formed by an additive manufacturing process involving layered deposition of dielectric and conductive materials. In implementations employing additive manufacturing processes, the micro vias 285 can be created concurrently with the formation of the buildup layers 245.

One or more of the buildup conductor layer 275 may have electrical connections to one or more of the core conductor layers 255. For a buildup conductor layer 275 adjacent to a core conductor layer 255, either a micro via 285 or via 265 can create an electrical connection between the two. If intervening layers separate the buildup conductor layer 275 from the core conductor layer 255, a pad stack made up of one or more vias 265 and/or 285 can form the electrical connection between the two.

The method 600 includes forming first surface features 232 for receiving the voltage regulator 215 and second surface 234 feature for receiving the load 220 (stage 660). The first and second surface features 232 and 234 can be formed on a top side of the buildup layers 245. The first and second surface features 232 and 234 can have electrical connections to at least one of the buildup conductor layers 275 and at least one of the core conductor layers 255 through one or more vias 285 and/or 265. The first surface features 232 can be configured to receive the voltage regulator 215. The second surface features 234 can be configured to receive the load 220. The micro vias 275 and/or vias 265 and the one or more core conductor layers 255 can form a low-impedance current path between the first surface features 232 and the second surface features 234. In implementations where the current barrier does not completely partition a buildup conductor layer 275, that buildup conductor layer 275 also forms part of the current path. In some implementations, additional surface features can be formed to receive bypass capacitors 225.

A second current path can similarly be created via third surface features configured for receiving other pins of the voltage regulator 215, and fourth surface features configured for receiving other pins of the load 220. The third and fourth surface features can electrically connect to one or more second buildup conductor layers 275 and one or more second core conductor layers 255 through separate vias 265 and 285. In this case, the first current path can be a current forward path from the voltage regulator 215 to the load 220, and the second current path can be a current return path from the load 220 to the voltage regulator 215.

The method 600 can optionally include preparing the first surface features 232 and the second surface features 234 to receive the voltage regulator 215 and the load 220 (stage 670). In some implementations the method 600 can proceed with additional fabrication steps up to and possibly including installing the voltage regulator 215, installing the load 220, and sealing the package. The preparation can include applying a solder mask, tinning or priming the surface features 232 and 234, and adding solder bumps for receiving the voltage regulator 215, the load 220, and the bypass capacitors 225. The voltage regulator 215 and the load 220 can be mounted to the surface features 232 and 234 using flip chip or wire bonding techniques. Any other mechanical bonding or underfilling can be performed to complete the bonding process. The IC package 210 can then be sealed with solid or curable resin cover, including a heat spreader brought into contact with surfaces of the voltage regulator 215 and the load 220 for the purpose of dissipating heat. The covered IC package 220 can then itself be prepped for mounting on a printed circuit board or elsewhere. Additional stages or processes may be added without departing from the scope of the invention.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:
1. An integrated circuit (IC) package comprising:
a plurality of core layers including alternating core conductor layers and core substrate layers;
a plurality of buildup layers disposed on the plurality of core layers and having a top side opposite the plurality of core layers, the plurality of buildup layers including alternating buildup conductor layers and buildup substrate layers;
first surface features on the top side for receiving a voltage regulator, the first surface features electrically connected to at least a first buildup conductor layer and a first core conductor layer by a first plurality of vias;
second surface features on the top side for receiving a load, the second surface features electrically connected to the first buildup conductor layer and the first core conductor layer by a second plurality of vias, wherein the first buildup conductor layer includes:

a substantially solid or continuous conductor plane extending between and electrically connected to the first plurality of vias and the second plurality of vias, and a gap defined in the conductor plane between the first plurality of vias and the second plurality of vias, the gap at least partially separating a portion of the conductor plane connected to the first plurality of vias from a portion of the conductor plane connected to the second plurality of vias.

2. The IC package of claim 1, wherein:
the first plurality of vias are distributed across a first region of the IC package,
the second plurality of vias are distributed across a second region of the IC package,
the first region extends to a first length measured in a direction orthogonal to an axis bisecting the first region and the second region,
the second region extends to a second length measured in the direction orthogonal to the axis,
the gap extends to a third length measured in the direction orthogonal to the axis, and
the third length is equal to or greater than the lesser of the first length and the second length.

3. The IC package of claim 1, wherein:
the first plurality of vias are distributed across a first region of the IC package,
the second plurality of vias are distributed across a second region of the IC package,
the first region extends to a first length measured in a direction orthogonal to an axis bisecting the first region and the second region,
the second region extends to a second length measured in the direction orthogonal to the axis,
the gap extends to a third length measured in the direction orthogonal to the axis, and
the third length is equal to or greater than the greater of the first length and the second length.

4. The IC package of claim 1, wherein the first plurality of vias, the first core conductor layer, and the second plurality of vias create a current forward path from the first surface features to the second surface features, the IC package comprising:
third surface features on the top side for receiving the voltage regulator, the third surface features electrically connected to at least a second buildup conductor layer and a second core conductor layer by a third plurality of vias; and
fourth surface features on the top side for receiving the load, the fourth surface features electrically connected to the second buildup conductor layer and the second core conductor layer by a fourth plurality of vias, wherein:
the second buildup conductor layer includes a second substantially solid or continuous conductor plane extending across and electrically connected to the third plurality of vias and the fourth plurality of vias,
the second conductor plane defines a second gap between the third plurality of vias and the fourth plurality of vias, the second gap at least partially separating a portion of the second conductor plane connected to the third plurality of vias from a portion of the second conductor plane connected to the fourth plurality of vias, and the third plurality of vias, the second core conductor layer, and the fourth plurality of vias create a current return path from the fourth surface features to the third surface features.

5. The IC package of claim 4, wherein:
the current forward path and the current return path are each capable of carrying at least 300 amps of current.

6. The IC package of claim 1, wherein:
the core conductor layers are thicker than the buildup conductor layers.

7. The IC package of claim 1, wherein:
the first buildup conductor layer includes a low-power trace or connection distinct from the conductor plane.

8. The IC package of claim 1, wherein:
the gap completely partitions the conductor plane.

9. The IC package of claim 1, wherein:
the IC package is capable of conveying 300 watts of power to the load.

10. The IC package of claim 1, comprising:
the voltage regulator, wherein the voltage regulator includes one or more of a switched-mode power supply, a direct-current voltage regulator, or an alternating-current-to-direct-current power convertor; and
the load, wherein the load includes one or more of an application-specific integrated circuit, a field-programmable gate array, a microprocessor, a graphics processor, or a networking switch processor.

11. A method of fabricating an integrated circuit (IC) package comprising:
forming a plurality of core layers including alternating core conductor layers and core substrate layers;
forming, on the plurality of core layers, a plurality of buildup layers including alternating buildup conductor layers and buildup substrate layers;
forming, on a top side of the plurality of buildup layers opposite the plurality of core layers, first surface features for receiving a voltage regulator, the first surface features electrically connected to at least a first buildup conductor layer and a first core conductor layer by a first plurality of vias;
forming, on the top side, second surface features for receiving a load, the second surface features electrically connected to the first buildup conductor layer and the first core conductor layer by a second plurality of vias, wherein the first buildup conductor layer includes:
a substantially solid or continuous conductor plane extending between and electrically connected to the first plurality of vias and the second plurality of vias, and
a gap defined in the conductor plane between the first plurality of vias and the second plurality of vias, the gap at least partially separating a portion of the conductor plane connected to the first plurality of vias from a portion of the conductor plane connected to the second plurality of vias.

12. The method of claim 11, wherein:
the first plurality of vias are distributed across a first region of the IC package,
the second plurality of vias are distributed across a second region of the IC package,
the first region extends to a first length measured in a direction orthogonal to an axis bisecting the first region and the second region,
the second region extends to a second length measured in the direction orthogonal to the axis,
the gap extends to a third length measured in the direction orthogonal to the axis, and the third length is equal to or greater than the lesser of the first length and the second length.

13. The method of claim 11, wherein:
the first plurality of vias are distributed across a first region of the IC package,
the second plurality of vias are distributed across a second region of the IC package,
the first region extends to a first length measured in a direction orthogonal to an axis bisecting the first region and the second region,
the second region extends to a second length measured in the direction orthogonal to the axis,
the gap extends to a third length measured in the direction orthogonal to the axis, and
the third length is equal to or greater than the greater of the first length and the second length.

14. The method of claim 11, wherein the first plurality of vias, the first core conductor layer, and the second plurality of vias create a current forward path from the first surface features to the second surface features, the method comprising:
forming third surface features on the top side for receiving the voltage regulator, the third surface features electrically connected to at least a second buildup conductor layer and a second core conductor layer by a third plurality of vias; and
forming fourth surface features on the top side for receiving the load, the fourth surface features electrically connected to the second buildup conductor layer and the second core conductor layer by a fourth plurality of vias, wherein:
the second buildup conductor layer includes a second substantially solid or continuous conductor plane extending across and electrically connected to the third plurality of vias and the fourth plurality of vias,
the second conductor plane defines a second gap between the third plurality of vias and the fourth plurality of vias, the second gap at least partially separating a portion of the second conductor plane connected to the third plurality of vias from a portion of the second conductor plane connected to the fourth plurality of vias, and
the third plurality of vias, the second core conductor layer, and the fourth plurality of vias create a current return path from the fourth surface features to the third surface features.

15. The method of claim 14, wherein:
the current forward path and the current return path are each capable of carrying at least 300 amps of current.

16. The method of claim 11, wherein:
the core conductor layers are thicker than the buildup conductor layers.

17. The method of claim 11, wherein:
the first buildup conductor layer includes a low-power trace or connection distinct from the conductor plane.

18. The method of claim 11, wherein:
the gap completely partitions the conductor plane.

19. The method of claim 11, wherein:
the IC package is capable of conveying 300 watts of power to the load.

20. The method of claim 11, comprising:
mounting the voltage regulator to the first features, wherein the load includes one or more of an application-specific integrated circuit, a field-programmable gate array, a microprocessor, a graphics processor, or a networking switch processor; and
mounting the load to the second surface features, wherein the voltage regulator includes one or more of a switched-mode power supply, a direct-current voltage regulator, or an alternating-current-to-direct-current power convertor.

\* \* \* \* \*